(12) United States Patent
Pfeuffer (10) Patent No.: US 12,322,636 B2
(45) Date of Patent: Jun. 3, 2025

(54) METHOD FOR SELECTING SEMICONDUCTOR COMPONENTS

(71) Applicant: ams-OSRAM International GmbH, Regensburg (DE)

(72) Inventor: Alexander Pfeuffer, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 401 days.

(21) Appl. No.: 17/797,671

(22) PCT Filed: Feb. 3, 2021

(86) PCT No.: PCT/EP2021/052510
§ 371 (c)(1),
(2) Date: Aug. 4, 2022

(87) PCT Pub. No.: WO2021/156290
PCT Pub. Date: Aug. 12, 2021

(65) Prior Publication Data
US 2023/0058398 A1    Feb. 23, 2023

(30) Foreign Application Priority Data
Feb. 5, 2020   (DE) .................. 102020102952.7

(51) Int. Cl.
*H01L 21/683*   (2006.01)
*H01L 21/66*    (2006.01)

(52) U.S. Cl.
CPC .......... *H01L 21/6835* (2013.01); *H01L 22/20* (2013.01); *H01L 2221/68322* (2013.01);
(Continued)

(58) Field of Classification Search
CPC ................ H01L 21/6835; H01L 22/20; H01L 2221/68322; H01L 2221/68354;
(Continued)

(56) References Cited

U.S. PATENT DOCUMENTS 7,087,502 B2 *   8/2006   Priewasser .......... H01L 21/6836
                                                                    438/455
9,209,348 B2 * 12/2015   Hu ........................ H01L 33/62
(Continued)

FOREIGN PATENT DOCUMENTS

CN        102903804 A    1/2013
CN        105359283 A    2/2016
(Continued)

*Primary Examiner* — Vu A Vu
(74) *Attorney, Agent, or Firm* — Slater Matsil, LLP (57) ABSTRACT

In an embodiment a method includes providing a donor substrate comprising a sacrificial layer, a connecting layer, and a plurality of semiconductor components arranged on the sacrificial layer, the connecting layer at least locally passing fully through the sacrificial layer so that each semiconductor component is at least locally in direct contact with the connecting layer, performing a selection method for identifying defective semiconductor components, selectively applying a cover layer onto a defective semiconductor component, at least one semiconductor component arranged directly adjacent to the defective semiconductor component and an intermediate region located between these semiconductor components, selectively etching the sacrificial layer, wherein the cover layer reduces or avoids etching the sacrificial layer in the intermediate region and removing the semiconductor components from the donor substrate, the defective semiconductor component remaining on the donor substrate.

20 Claims, 9 Drawing Sheets

(52) U.S. Cl.
CPC ............... *H01L 2221/68354* (2013.01); *H01L 2221/68368* (2013.01)

(58) Field of Classification Search
CPC . H01L 2221/68368; H01L 2221/68318; H01L 2221/68381; H01L 33/0095; H01L 22/10
USPC ........................................................... 438/5
See application file for complete search history.

(56) References Cited

U.S. PATENT DOCUMENTS

| | | | | |
|---|---|---|---|---|
| 9,450,147 | B2* | 9/2016 | McGroddy | ............. H01L 33/30 |
| 9,768,345 | B2* | 9/2017 | Hu | ............................ H01L 33/20 |
| 10,515,926 | B2* | 12/2019 | Shen | ........................ H01L 21/78 |
| 10,522,710 | B2* | 12/2019 | Bower | ..................... H01L 33/44 |
| 10,607,877 | B2* | 3/2020 | Lee | ........................... H01L 33/62 |
| 11,955,506 | B2* | 4/2024 | Lin | ............................ H01L 33/62 |
| 2011/0136324 | A1 | 6/2011 | Ashdown et al. | |
| 2011/0151588 | A1 | 6/2011 | Ashdown et al. | |
| 2011/0311276 | A1 | 12/2011 | Yonehara et al. | |
| 2012/0315710 | A1* | 12/2012 | Hozawa | .................. H01L 22/20 |
| | | | | 438/109 |
| 2013/0026511 | A1 | 1/2013 | Yeh et al. | |
| 2015/0008389 | A1 | 1/2015 | Hu et al. | |
| 2015/0214420 | A1 | 7/2015 | Hu et al. | |
| 2016/0093600 | A1 | 3/2016 | Bower et al. | |
| 2016/0104695 | A1 | 4/2016 | Yeh et al. | |
| 2016/0172253 | A1 | 6/2016 | Wu et al. | |
| 2018/0261658 | A1 | 9/2018 | Cok et al. | |
| 2018/0332744 | A1 | 11/2018 | Pourchet et al. | |
| 2018/0374738 | A1 | 12/2018 | Lee et al. | |
| 2019/0058080 | A1 | 2/2019 | Ahmed et al. | |
| 2019/0326470 | A1 | 10/2019 | Bower et al. | |
| 2019/0393069 | A1 | 12/2019 | Paranjpe et al. | |
| 2019/0393376 | A1 | 12/2019 | Höppel | |
| 2022/0005794 | A1* | 1/2022 | Wu | ..................... H01L 33/0095 |
| 2022/0181210 | A1* | 6/2022 | Kamikawa | .......... H01L 21/7806 |

FOREIGN PATENT DOCUMENTS

| | | |
|---|---|---|
| CN | 109121318 A | 1/2019 |
| CN | 109585617 A | 4/2019 |
| CN | 110265348 A | 9/2019 |
| WO | 2019172707 A1 | 9/2019 |

\* cited by examiner

METHOD FOR SELECTING SEMICONDUCTOR COMPONENTS

This patent application is a national phase filing under section 371 of PCT/EP2021052510, filed Feb. 3, 2021, which claims the priority of German patent application 102020102952.7, filed Feb. 5, 202, each of which is incorporated herein by reference in its entirety.

TECHNICAL FIELD

A method for selecting semiconductor components is provided. The method is suitable, for example, for the selection of optoelectronic semiconductor components. Optoelectronic semiconductor components are suitable in particular for generating and/or detecting electromagnetic radiation, preferably light which is perceptible to the human eye.

SUMMARY

Embodiments provide a method for selecting semiconductor components, which allows simplified implementation.

According to at least one embodiment of the method for selecting semiconductor components, a donor substrate which comprises a sacrificial layer, a connecting layer arranged on the sacrificial layer and a multiplicity of semiconductor components, which are arranged on the sacrificial layer, is provided. In particular, the semiconductor components are arranged only on a side of the sacrificial layer facing away from the connecting layer. The sacrificial layer is, for example, formed with a material which has a low resistance to an etching method chosen and suitable for the selection method.

The connecting layer is, in particular, formed with a material which has a high resistance to the etching method. Particularly advantageously, the materials of the sacrificial layer and of the connecting layer are matched to one another in such a way that they have a maximally different resistance to an etching method and consequently can be etched particularly selectively.

In particular, the connecting layer has a multilayer configuration and comprises a multiplicity of layers, which are arranged above one another. For example, the connecting layer comprises a core region and an intermediate layer. The intermediate layer is preferably arranged on the side of the connecting layer facing toward the semiconductor components. In other words, the intermediate layer is in particular arranged between the core layer and the semiconductor components.

The intermediate layer is, for example, formed with one of the following materials: silicon oxide, silicon nitride, aluminum oxide, indium tin oxide. The core layer is formed in particular with benzocyclobutene. By means of the intermediate layer, an adhesion of the semiconductor components on the connecting layer is advantageously adjustable accurately. Furthermore, in this way direct contact of the semiconductor components with the core layer can be avoided, for example in order to prevent contamination or another detrimental effect of the connecting layer on the semiconductor components.

According to at least one embodiment of the method for selecting semiconductor components, the connecting layer at least locally passes fully through the sacrificial layer so that each semiconductor component is at least locally in direct contact with the connecting layer. In particular, the connecting layer at least locally passes fully through the sacrificial layer starting from the opposite side from the semiconductor components. The semiconductor components therefore adhere on the connecting layer and on the sacrificial layer. For example, the sacrificial layer comprises recesses in the shape of cylinders or conical frustums, which pass fully through the sacrificial layer and are filled with the material of the connecting layer.

According to at least one embodiment of the method for selecting semiconductor components, a selection method for identifying defective semiconductor components is carried out. For example, defective components have undesirably large deviations in a luminous flux emitted by them, a color locus of the luminous flux, an optical emission characteristic or their electrical resistance. The selection method may be based on a purely optical, for example camera-assisted inspection of the optoelectronic components. Going further, the selection method may comprise optical excitation of the optoelectronic components by means of electromagnetic radiation having a first wavelength and determination of a photoluminescence of the semiconductor components. The selection method may, however, also be based on previously known parameters from the production of the semiconductor components. For example, defective semiconductor components may be deduced directly from the conditions in a growth process of the semiconductor components.

According to at least one embodiment of the method for selecting semiconductor components, a cover layer is applied selectively onto a defective semiconductor component and at least one semiconductor component arranged directly adjacent to the defective semiconductor component and an intermediate region exposed between these semiconductor components. The intermediate region describes, in particular, a region of the sacrificial layer which extends between two directly adjacent semiconductor components. Preferably, the cover layer extends inside the lateral extent of the defective semiconductor component and the at least one directly adjacent semiconductor component. Particularly preferably, the cover layer extends only inside the intermediate region and covers the intermediate region fully.

According to at least one embodiment of the method for selecting semiconductor components, selective etching of the sacrificial layer is carried out, the cover layer reducing or avoiding etching of the sacrificial layer in the intermediate region. The sacrificial layer is at least partially, preferably fully, removed at positions which are not covered by the cover layer. The cover layer is, in particular, chemically stable against an etching method used. By means of the cover layer, etching of the sacrificial layer in the intermediate region and/or below the semiconductor components is therefore reduced or avoided. In other words, selective removal of the sacrificial layer takes place below semiconductor components which are not covered by the cover layer.

According to at least one embodiment of the method for selecting semiconductor components, semiconductor components are extracted from the donor substrate, the defective semiconductor component remaining on the donor substrate. In other words, only semiconductor components which have not been identified as defective are extracted from the donor substrate.

Conversely, defective components remain on the donor substrate. By the selective etching of the sacrificial layer, adhesion on the sacrificial layer of the non-defective semiconductor components to be extracted is purposely avoided. Since the sacrificial layer below defective components is protected from the etching process by the cover layer, the adhesion of the defective semiconductor components is greater than the adhesion of the semiconductor components below which the sacrificial layer is removed. Because of the increased adhesion, a greater force is needed to detach the defective semiconductor components from the donor substrate than to detach non-defective semiconductor components.

According to at least one embodiment of the method for selecting semiconductor components, the method comprises the steps:
A) Providing a donor substrate comprising a sacrificial layer, a connecting layer arranged on the sacrificial layer, and a multiplicity of semiconductor components, which are arranged on the sacrificial layer, the connecting layer at least locally passing fully through the sacrificial layer so that each semiconductor component is at least locally in direct contact with the connecting layer.
B) Carrying out a selection method for identifying defective semiconductor components.
C) Selectively applying a cover layer onto a defective semiconductor component and at least one semiconductor component arranged directly adjacent to the defective semiconductor component and an intermediate region exposed between these semiconductor components.
D) Selectively etching the sacrificial layer, the cover layer reducing or avoiding etching of the sacrificial layer in the intermediate region.
E) Extracting semiconductor components from the donor substrate, the defective semiconductor component remaining on the donor substrate.

A method as described here for selecting semiconductor components is based inter alia on the following considerations: during the production of a multiplicity of semiconductor components in a wafer assembly, defective semiconductor components may arise. In order to avoid further outlay in subsequent method steps, defective semiconductor components can be advantageously withdrawn from the production process. For this purpose, selection of defective components from a multiplicity of semiconductor components in a wafer assembly is advantageous. For example, defective semiconductor components in the wafer assembly are identified and purposely detached successively from the wafer assembly by means of a serial process. However, serial extraction and rejection of defective semiconductor components, are associated with a high time expenditure.

The method described here for selecting semiconductor components makes use inter alia of the idea of purposely influencing the adhesion of semiconductor components on a donor substrate. Thus, defect-free components are influenced in such a way that they have reduced adhesion on the donor substrate and can easily be extracted from the donor substrate in a subsequent process for extracting semiconductor components. Conversely, defective components are treated in such a way that they purposely have higher adhesion on the donor substrate than defect-free components to be extracted. Defective components therefore remain on the donor substrate and can be rejected. The method step of extracting the semiconductor components relates in particular to a multiplicity of defect-free semiconductor components simultaneously. Preferably, a mass transfer method is a part of the method step of extracting the semiconductor components. The method described here can thus advantageously be used for the parallel extraction of a multiplicity of semiconductor components, so that serial extraction and rejection of defective semiconductor components from the donor substrate can advantageously be obviated.

According to at least one embodiment of the method for selecting semiconductor components, the cover layer is formed with a photosensitive polymer. A photosensitive polymer is characterized in that crosslinking of the polymer is modified by irradiation with electromagnetic radiation having a particular wavelength. For example, a chemical crosslinking reaction may be carried out so that the photosensitive polymer has a reduced solubility after the irradiation (negative photoresist). Furthermore, however, photosensitive polymers may also have an increased solubility after the irradiation with electromagnetic radiation, if the crosslinking is reduced by the radiation (positive photoresist).

According to at least one embodiment of the method for selecting semiconductor components, the photosensitive polymer is formed with a negative photoresist. A negative photoresist is distinguished, in particular, in that its solubility decreases after irradiation with electromagnetic radiation having a particular wavelength. Since the proportion of an area of the cover layer to be illuminated is small, the use of a negative photoresist is advantageous since only a small area needs to be illuminated.

According to at least one embodiment of the method for selecting semiconductor components, the cover layer is applied in method step C) by means of a selective printing method. During a selective printing method, for example by means of a non-impact printing (NIP) method, application of the cover layer is preferably carried out in a region intended therefor. For example, the application of the cover layer is carried out by means of inkjet printing. Selective illumination of the donor substrate is therefore advantageously not necessary and the donor substrate may instead be illuminated surface-wide in one step.

According to at least one embodiment of the method for selecting semiconductor components, the cover layer is initially applied surface-wide onto the donor substrate and the cover layer is subsequently illuminated selectively, for example by means of laser direct imaging. The selective illumination of the cover layer is preferably carried out in the intermediate region of the selected semiconductor component. The use of laser direct imaging allows particularly flexible adaptation of the desired regions to be illuminated. In particular, an illumination mask is therefore advantageously not necessary.

According to at least one embodiment of the method for selecting semiconductor components, the extraction of the semiconductor components in method step F) is carried out by means of an adhesion die which comprises a multiplicity of adhesion faces. In particular, a semiconductor component is respectively in direct contact with the adhesion die respectively via an adhesion face. The adhesion faces of the adhesion die are, for example, formed with silicone. An adhesion die allows particularly simple and rapid transport of a multiplicity of semiconductor components.

According to at least one embodiment of the method for selecting semiconductor components, the adhesion of the semiconductor components onto the adhesion faces of the adhesion die takes place predominantly by means of Van der Waals forces. In particular, no adhesive or other adhesion structure is therefore used for adhesion of the semiconductor components onto the adhesion faces. The use of Van der Waals forces advantageously allows high reproducibility of the adhesion effect of the adhesion die.

According to at least one embodiment of the method for selecting semiconductor components, the adhesion faces are arranged on the adhesion die with a first lateral spacing from one another which corresponds to two or more times a second lateral spacing of the semiconductor components with respect to one another on the donor substrate. In other words, the density of the adhesion faces of the adhesion die corresponds to one half or a fraction of the density of the semiconductor components with respect to one another on the donor substrate. Advantageously, the adhesion die is therefore more simply producible since lower requirements for the production accuracy are sufficient. In the case of two times the spacing, all semiconductor components could therefore be detached from the donor substrate with four transfer processes of the adhesion die.

According to at least one embodiment of the method for selecting semiconductor components, the etching of the sacrificial layer in method step B) is carried out by means of an isotropic etching method. An isotropic etching method is distinguished in particular in that its etching rate is approximately the same in every spatial direction. An isotropic etching method allows particularly good undercut etching of the semiconductor components for detachment of the sacrificial layer.

According to at least one embodiment of the method for selecting semiconductor components, the etching of the sacrificial layer in method step D) is carried out by means of plasma etching or a wet chemical etching method. A suitable etchant for plasma etching is, for example, a fluorine plasma. In particular, hydrofluoric acid or hydrogen peroxide are suitable for use as an etchant in a wet chemical etching method. Plasma etching or wet chemical etching methods are distinguished in particular by a high isotropy.

According to at least one embodiment of the method for selecting semiconductor components, the sacrificial layer is formed with one of the following materials: silicon, silicon dioxide, germanium, zinc oxide. The material of the sacrificial layer is suitable in particular, for an isotropic etching method. In particular, the sacrificial layer is a mechanically supporting constituent part of the donor substrate.

According to at least one embodiment of the method for selecting semiconductor components, the connecting layer is formed with one of the following materials: solder material, benzocyclobutene (BCB). For example, a eutectic metal alloy based on gold and/or tin is suitable as a solder material. The connecting layer is advantageously chemically stable against an etching method which is used to remove the sacrificial layer.

According to at least one embodiment of the method for selecting semiconductor components, the connecting layer has a contact area respectively with a semiconductor component of at least 0.01 $\mu m^2$ and at most 10 $\mu m^2$, preferably at least 0.2 $\mu m^2$ and at most 2 $\mu m^2$. The contact area is the area on which the connecting layer and the semiconductor component are in direct contact with one another. By means of the contact area, the adhesion between the semiconductor components and the connecting layer is purposely adjusted.

According to at least one embodiment of the method for selecting semiconductor components, the cover layer is removed from the donor substrate after the etching of the sacrificial layer in method step D) and before the extraction of the semiconductor components in method step E). For example, the cover layer is thermally decomposed. In this way, it is advantageously possible to avoid the cover layer being able to interfere with the extraction of the semiconductor components. For example, the cover layer could undesirably influence the process of extracting the semiconductor components by means of an adhesion die through a height difference which it causes on the otherwise flat surface of the semiconductor components on the donor substrate.

According to at least one embodiment of the method for selecting semiconductor components, a measurement of a photoluminescence property of the semiconductor components is carried out in the selection method in method step B). For example, excitation of the semiconductor components by means of electromagnetic radiation having a first wavelength is carried out. With the aid of the reaction of the semiconductor components, classification is subsequently carried out into defective semiconductor components and defect-free semiconductor components. Such a selection method is advantageously contactless and is carried out without electrical contacting of the semiconductor components.

A method as described here for selecting semiconductor components is suitable, in particular, for the production of optoelectronic semiconductor components for video walls, displays for augmented reality or projectors. The method is likewise suitable for all applications which use printable μLEDs.

BRIEF DESCRIPTION OF THE DRAWINGS

Further advantages and advantageous configurations and refinements of the method for selecting semiconductor components may be found in the following exemplary embodiments presented in conjunction with the figures, in which.

DETAILED DESCRIPTION OF ILLUSTRATIVE EMBODIMENTS

Elements which are the same or similar, or which have the same effect, are provided with the same references in the figures. The figures and the size proportions of the elements represented in the figures with respect to one another are not to be considered as being true to scale. Rather, individual elements may be represented exaggeratedly large for improved representability and/or improved comprehensibility.

Figure 1A:
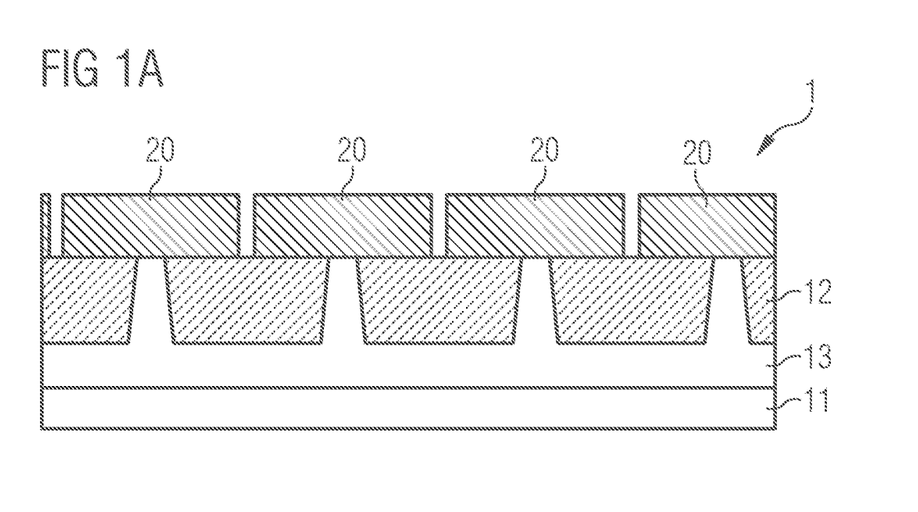
FIGS. 1A and 1B show a schematic sectional view of a donor substrate and a schematic plan view of a donor substrate in a first step of the method described here for selecting semiconductor components according to a first exemplary embodiment.
Figure 1B:
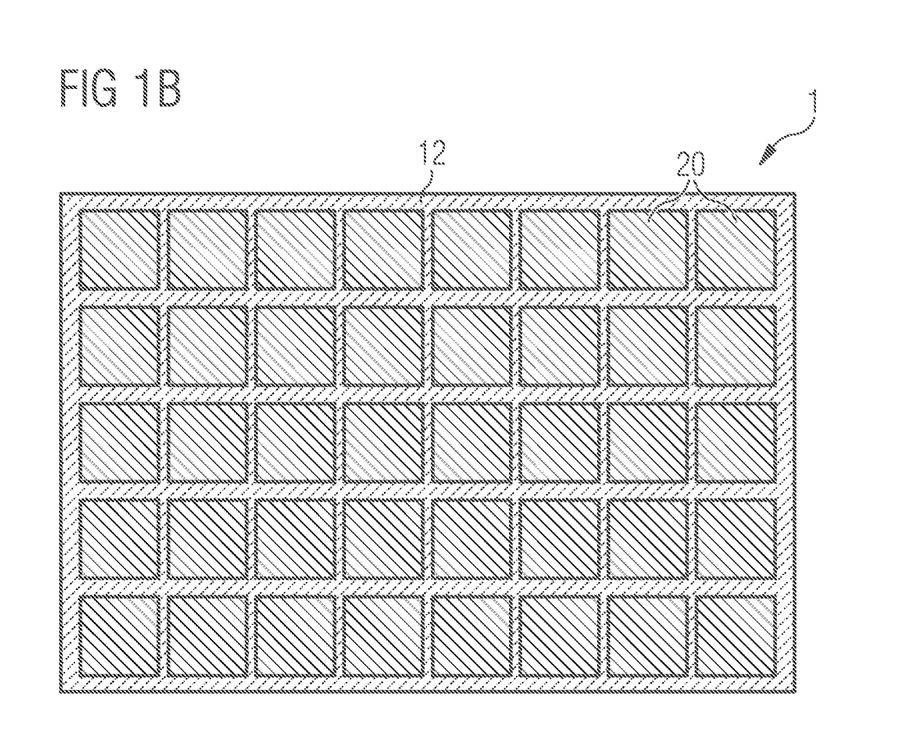

In the schematic views of a donor substrate 1 as shown in FIGS. 1A and 1B in a step of a method as described here for selecting semiconductor components 20 according to a first exemplary embodiment, a donor substrate 1 which comprises a carrier layer 11, a connecting layer 13, a sacrificial layer 12 and a multiplicity of semiconductor components 20 is provided. The connecting layer 13 is arranged between the carrier layer 11 and the sacrificial layer 12. The connecting layer 13 locally passes fully through the sacrificial layer 12 from the side facing toward the carrier layer 11. The connecting layer 13 is at least locally in direct contact respectively with a semiconductor component 20. The connecting layer 13 comprises protrusions in the form of conical frustums, which pass fully through the sacrificial layer 12 and are therefore in direct contact respectively with a semiconductor component 20. The connecting layer 13 is formed with benzocyclobutene.

The semiconductor components 20 adhere on the sacrificial layer 12 and the connecting layer 13. The sacrificial layer 12 is formed with silicon. The sacrificial layer 12 is a mechanically supporting constituent part of the donor substrate 1. The carrier layer 11 is formed with sapphire and is likewise a mechanically supporting constituent part of the donor substrate 1. According to the plan view of a donor substrate 1 as shown in FIG. 1B, the multiplicity of semiconductor components 20 are arranged laterally separated adjacent to one another on the sacrificial layer 12. Each semiconductor component 20 is at least locally in contact with the connecting layer 13.

Figure 2A:
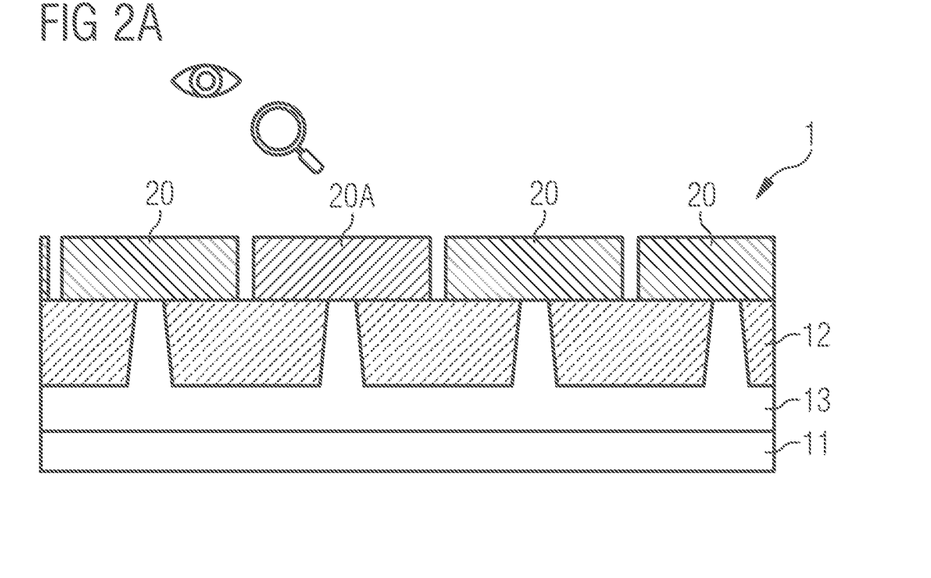
FIGS. 2A and 2B show a schematic sectional view of a donor substrate and a schematic plan view of a donor substrate in a further step of the method described here for selecting semiconductor components according to the first exemplary embodiment.
Figure 2B:
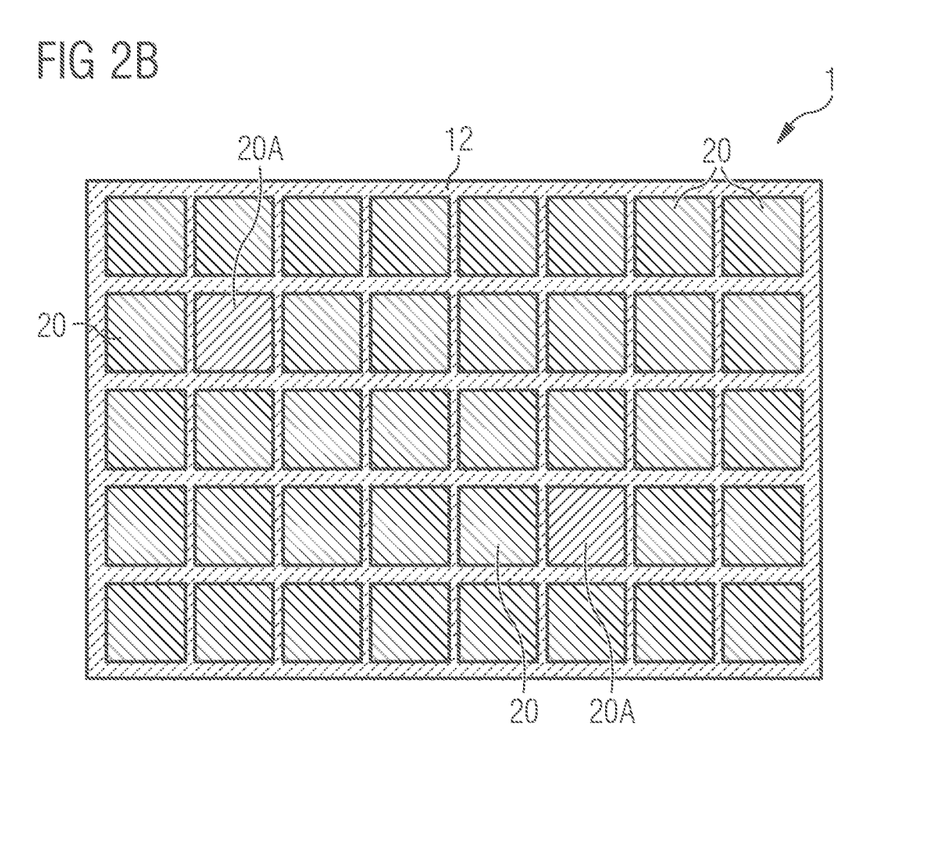

FIGS. 2A and 2B show schematic views of a donor substrate 1 in a further step of a method as described here for selecting semiconductor components 20 according to the first exemplary embodiment. In FIGS. 2A and 2B, a selection method for identifying defective semiconductor components 20A is carried out. The identification of defective semiconductor components 20A is carried out by means of a photoluminescence excitation of all the semiconductor components 20. During the excitation of the semiconductor components 20 by means of incident electromagnetic radiation having a first wavelength, a reaction of the semiconductor components 20 provides information concerning whether a semiconductor component 20 is a defective semiconductor component 20A. In the plan view of the donor substrate 1 as represented in FIG. 2B, the defective semiconductor components 20A to which defect-free semiconductor components 20 are respectively annularly adjacent can be seen.

Figure 3:
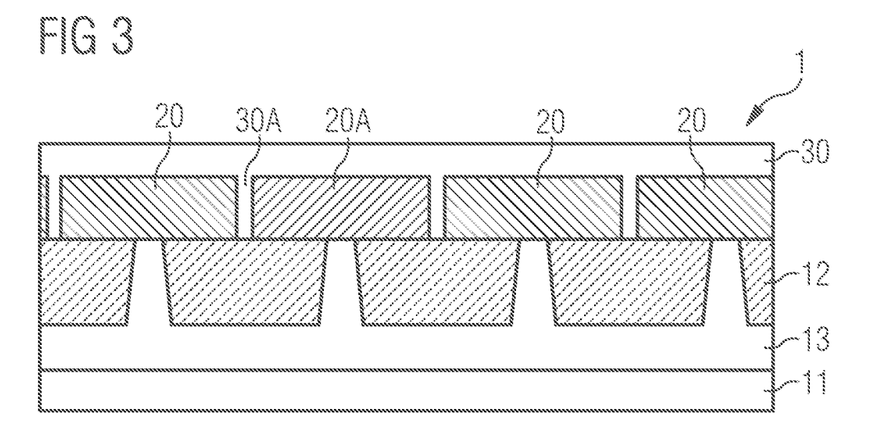
FIG. 3 shows a schematic sectional view of a donor substrate in a further step of the method described here for selecting semiconductor components according to the first exemplary embodiment.

FIG. 3 shows a schematic sectional view of a donor substrate 1 in a further step of a method as described here for selecting semiconductor components 20 according to the first exemplary embodiment. In this method step, a cover layer 30 is applied onto the donor substrate 1 on the side facing toward the semiconductor components 20. The cover layer 30 is formed with a negative photoresist and is applied surface-wide on the donor substrate 1. The cover layer 30 in particular also penetrates into an intermediate region 30A which extends between the defective semiconductor component 20A and a directly adjacent semiconductor component 20.

Figure 4:
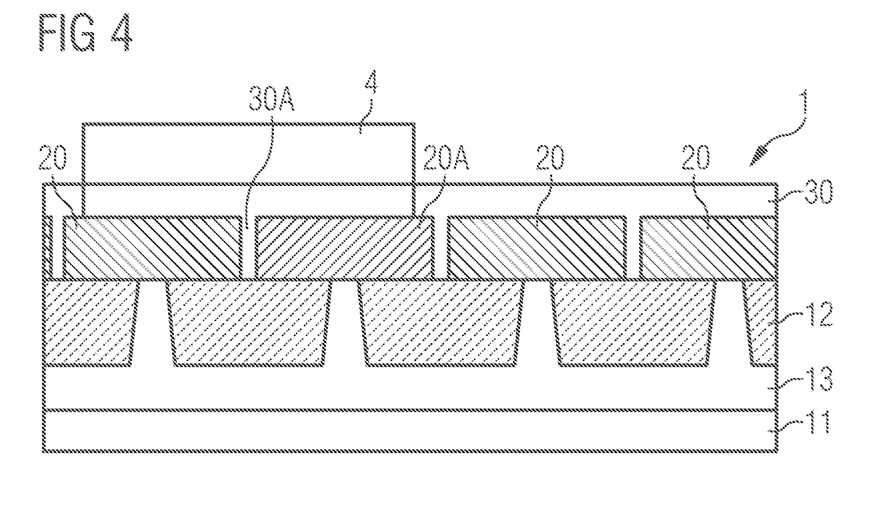
FIG. 4 shows a schematic sectional view of a donor substrate in a further step of the method described here for selecting semiconductor components according to the first exemplary embodiment.

FIG. 4 shows a schematic sectional view of a donor substrate 1 in a further step of a method as described here for selecting semiconductor components 20 according to the first exemplary embodiment. In the method step shown here, selective illumination of the cover layer 30 by means of electromagnetic radiation 4 is carried out in a laser direct imaging process. The electromagnetic radiation 4 illuminates the cover layer 30 in the intermediate region 30A. By means of the illumination of the intermediate region 30A, a reduction of the solubility of the cover layer 30 takes place in the intermediate region 30A.

Figure 5A:
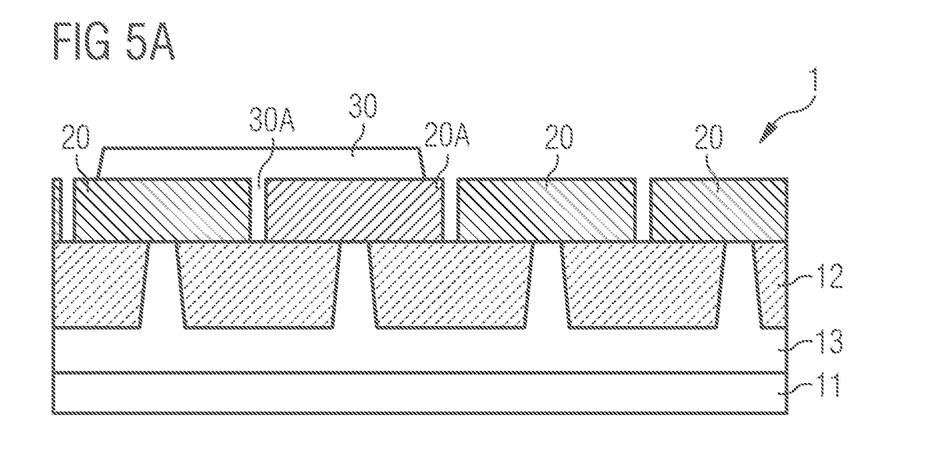
FIGS. 5A and 5B show a schematic sectional view of a donor substrate and a schematic plan view of a donor substrate in a further step of the method described here for selecting semiconductor components according to the first exemplary embodiment.
Figure 5B:
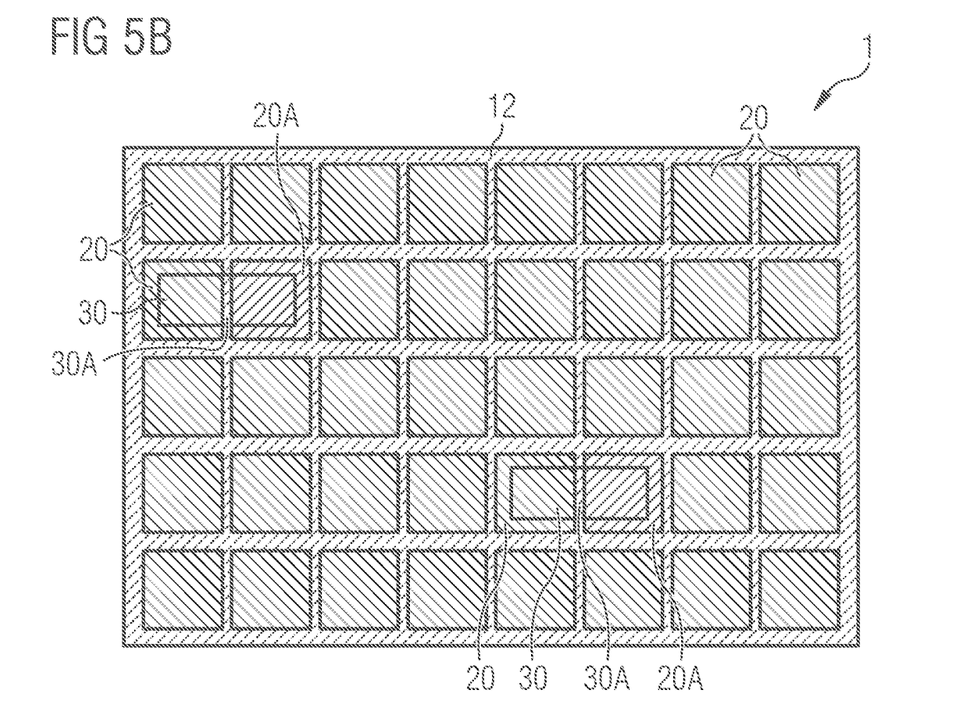

FIGS. 5A and 5B show schematic views of a donor substrate 1 in a further step of a method as described here for selecting semiconductor components 20 according to the first exemplary embodiment. In the method step shown here, the cover layer 30 is already detached at the unilluminated positions. The cover layer 30 remains particularly in the intermediate region 30A and is additionally arranged on the opposite side of the defective component 20A and of the directly adjacent semiconductor component 20 from the sacrificial layer 12. In the plan view of the donor substrate 1 as shown in FIG. 5B, the lateral extent of the cover layer 30 can be seen clearly. The cover layer 30 extends over the intermediate region 30A onto the defective semiconductor component 20A and the directly adjacent semiconductor component 20.

Figure 6:
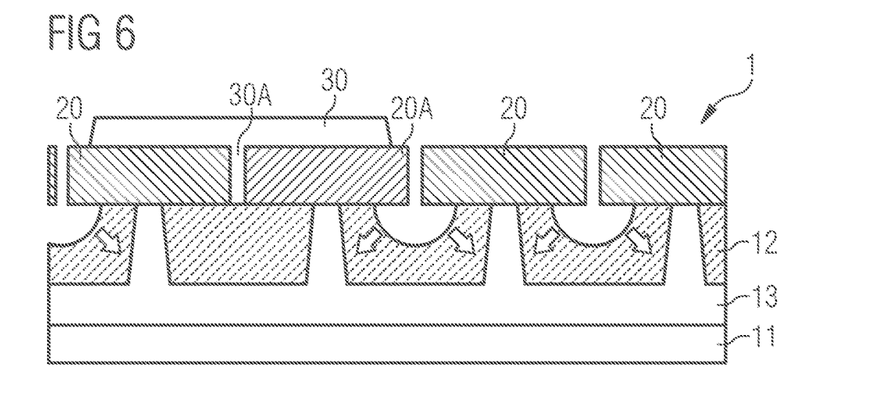
FIG. 6 shows a schematic sectional view of a donor substrate in a further step of the method described here for selecting semiconductor components according to the first exemplary embodiment.

FIG. 6 shows a schematic sectional view of a donor substrate 1 in a further step of a method as described here for selecting semiconductor components 20 according to the first exemplary embodiment. In the method step shown here, the sacrificial layer 12 is etched in the regions intended therefor. The intermediate region 30A, which is covered by the cover layer 30, is advantageously attacked less or not at all by the method for etching the sacrificial layer 12. The sacrificial layer 12 therefore remains particularly in the intermediate region 30A and below the defective semiconductor component 20A and the directly adjacent semiconductor component 20. In the other regions, the sacrificial layer 12 is at least partially removed.

Figure 7:
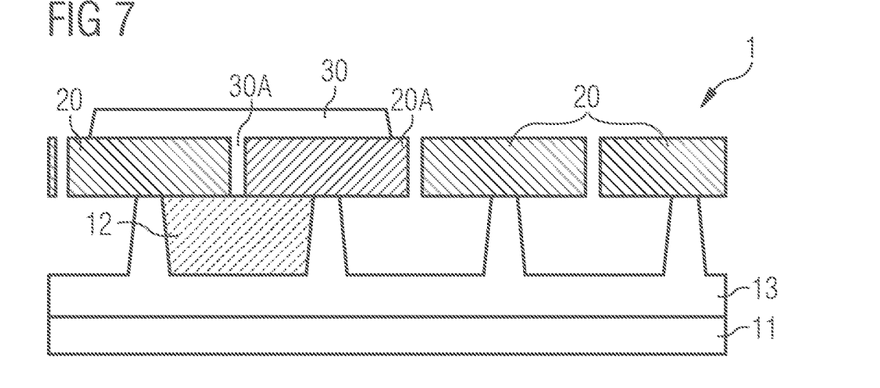
FIG. 7 shows a schematic sectional view of a donor substrate in a further step of the method described here for selecting semiconductor components according to the first exemplary embodiment.

FIG. 7 shows a schematic sectional view of a donor substrate 1 in a further step of a method as described here for selecting semiconductor components 20 according to the first exemplary embodiment. The sacrificial layer 12 is already removed locally in this method step. The sacrificial layer 12 is still at least partially present below the defective semiconductor component 20A and the directly adjacent semiconductor component 20. This is associated with increased adhesion on the donor substrate 1 of the defective semiconductor component 20A and of the directly adjacent semiconductor component 20.

Figure 8:
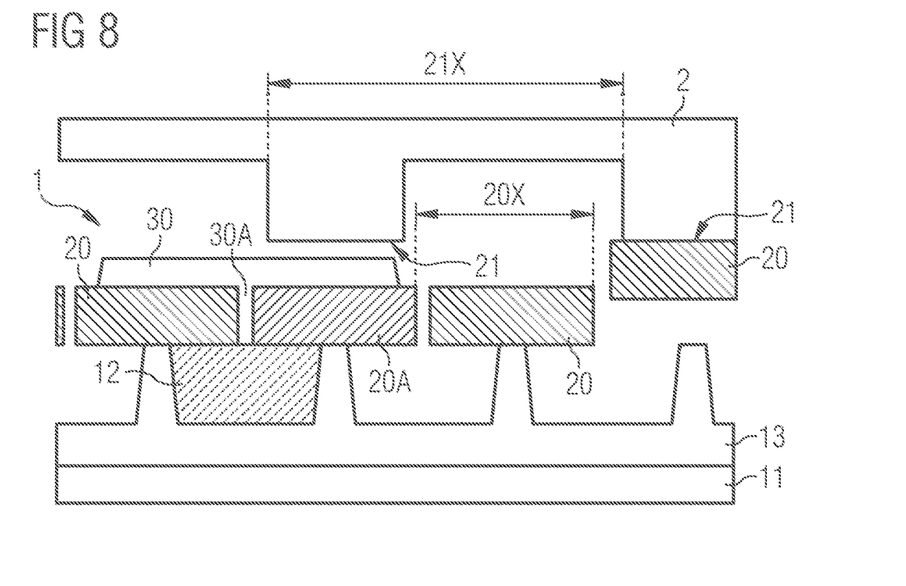
FIG. 8 shows a schematic sectional view of a donor substrate in a further step of the method described here for selecting semiconductor components according to the first exemplary embodiment.

FIG. 8 shows a schematic sectional view of a donor substrate 1 in a further step of a method as described here for selecting semiconductor components 20 according to the first exemplary embodiment. In the method step shown here, semiconductor components 20 are extracted from the donor substrate 1 by means of an adhesion die 2. The adhesion die 2 comprises a multiplicity of adhesion faces 21 and is formed with a silicone.

The adhesion faces 21 are arranged with a first lateral spacing 21X. The semiconductor components 20 are arranged on the donor substrate 1 with a second lateral spacing 20X. The second lateral spacing 20X corresponds to one half of the first lateral spacing 21X. The increased spacing of the adhesion faces 21 on the adhesion die 2 allows particularly simple production of the adhesion die 2 and reduces a requirement for the accuracy of the positioning of the adhesion faces 20 on the adhesion die 2.

By means of adhesion via Van der Waals forces the adhesion die 2 picks up the semiconductor components 20 whose adhesion on the donor substrate 1 is low enough and thus removes them from the donor substrate 1. The defective semiconductor component 20A and the directly adjacent semiconductor component 20 are still connected to the donor substrate 1 by means of the sacrificial layer 12. The adhesion capability of these semiconductor components 20, 20A on the donor substrate 1 is therefore increased in such a way that the adhesion force on the adhesion face 21 of the adhesion die 2 is not sufficient to detach them from the donor substrate 1.

Figure 9:
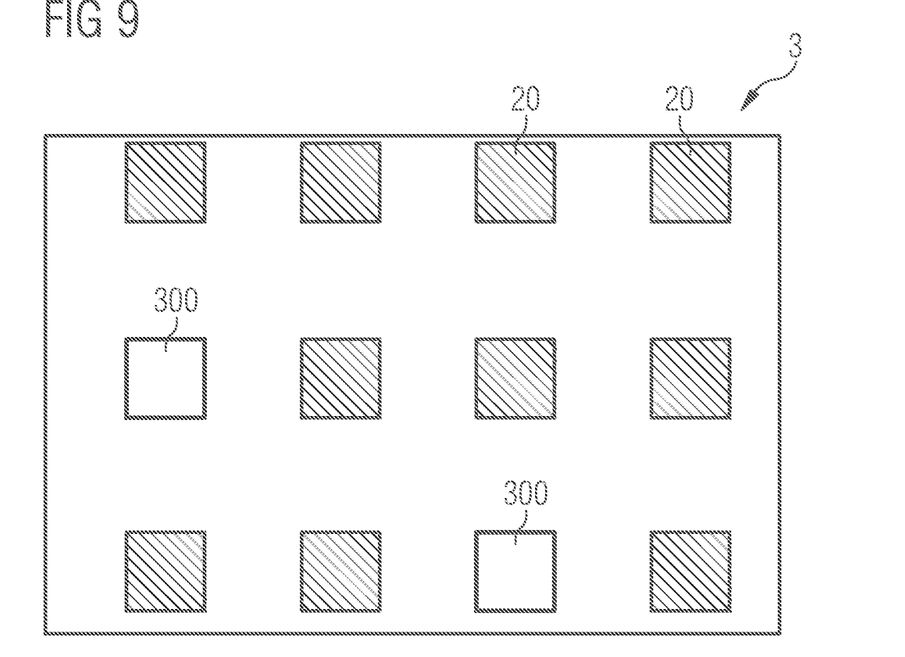
FIG. 9 shows a schematic plan view of a target substrate in a further step of the method described here for selecting semiconductor components according to the first exemplary embodiment.

FIG. 9 shows a schematic plan view of a target substrate 3 in a further step of a method as described here for selecting semiconductor components 20 according to the first exemplary embodiment. The target substrate 3 is formed with sapphire. A multiplicity of semiconductor components 20 are already arranged on the target substrate 3 shown in FIG. 9. In individual empty spaces 300, there are still no semiconductor components 20. At these positions, no transfer of semiconductor components 20 has taken place since they could not be extracted from the donor substrate 1 because there are defective semiconductor components 20A at these positions on the donor substrate 1.

Figure 10:
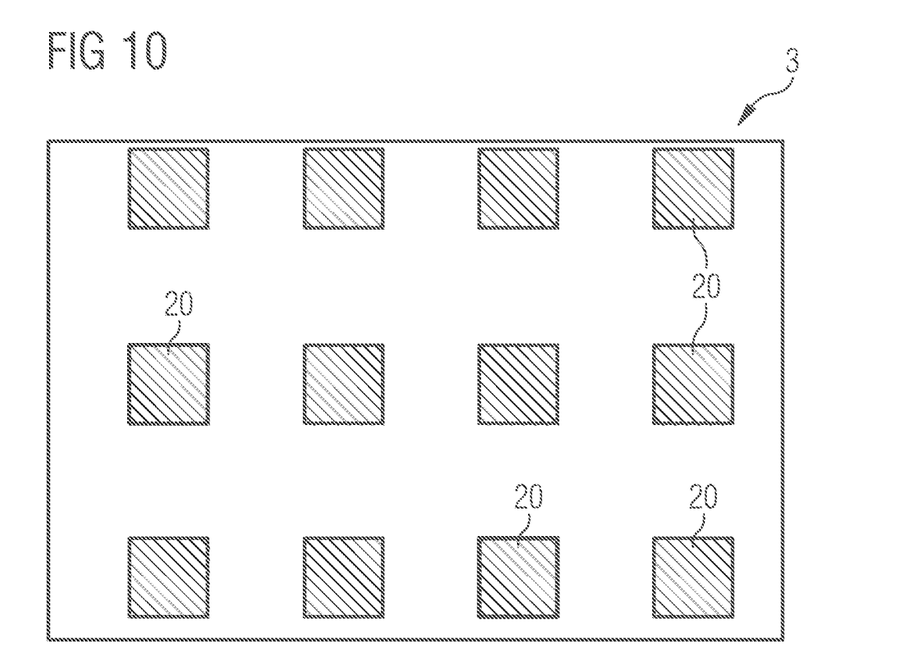
FIG. 10 shows a schematic plan view of a target substrate in a further step of the method described here for selecting semiconductor components according to the first exemplary embodiment.

FIG. 10 shows a schematic plan view of a target substrate 3 in a further step of a method for selecting semiconductor components 20 according to the first exemplary embodiment. The empty spaces 300 of the exemplary embodiment shown in FIG. 9 are respectively filled with a semiconductor component 20 which has been transferred by means of an adhesion die 2 that can take up only one semiconductor component 20 at a time. A target substrate 3 is thus obtained having continuously fitted semiconductor components 20 with a lateral spacing that corresponds to two times the second lateral spacing 20X of the semiconductor components 20 on the donor substrate 1. The lateral spacing of the semiconductor components 20 on the target substrate 3 therefore corresponds to the first spacing 21X of the adhesion faces 21 on the adhesion die 2.

Figure 11:
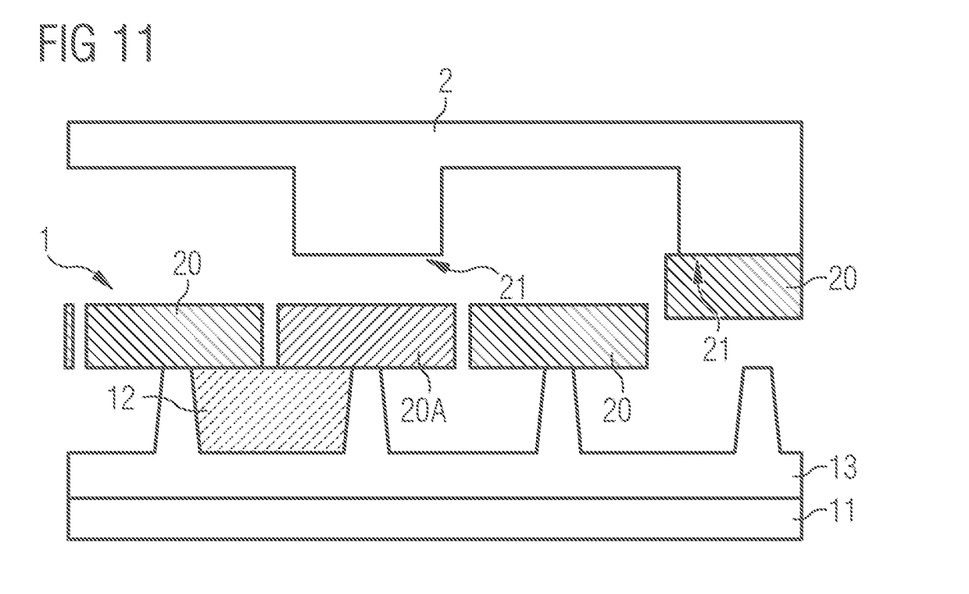
FIG. 11 shows a schematic sectional view of a donor substrate in a further step of the method described here for selecting semiconductor components according to a second exemplary embodiment.

FIG. 11 shows a further step of a method as described here for selecting semiconductor components 20 according to the second exemplary embodiment. In the method step shown here, the cover layer 30 is removed from the donor substrate 1 before the method step E) in which the semiconductor components 20 are extracted from the donor substrate 1. For example, the cover layer 30 has been removed from the donor substrate 1 by means of a high-temperature method. The adhesion faces 21 can thus adhere particularly well on the now flatly configured surface of the semiconductor components 20. The defective semiconductor component 20A and the directly adjacent semiconductor component 20 are connected to the donor substrate 1 with increased adhesion by the remaining sacrificial layer 12. This increased adhesion is sufficient to prevent extraction of the defective semiconductor component 20A and of the directly adjacent semiconductor component 20 by the adhesion face 21 of the adhesion die 2.

Figure 12:
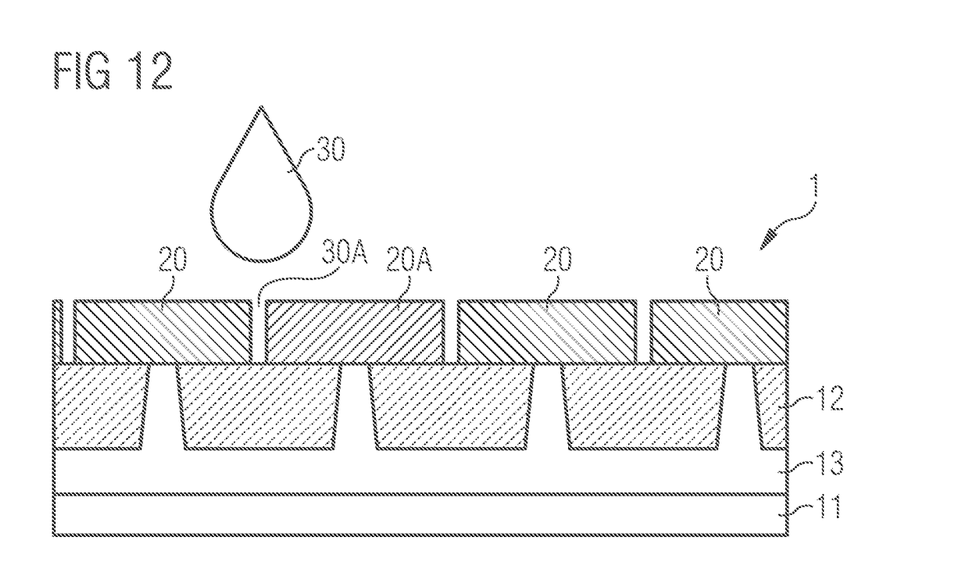
FIG. 12 shows a schematic sectional view of a donor substrate in a further step of the method described here for selecting semiconductor components according to a third exemplary embodiment.

FIG. 12 shows a further step of a method as described here for selecting semiconductor components 20 according to the third exemplary embodiment. In this method step, selective application of the cover layer 30 is carried out by means of a printing method. For example, the printing method is carried out as a non-impact printing (NIP) method, for example an inkjet printing method. The cover layer 30 is preferably applied in an intermediate region 30A, which is arranged between a defective semiconductor component 20A and a directly adjacent semiconductor component 20. This intermediate region 30A is covered by the cover layer 30. Surface-wide illumination of the donor substrate 1 is subsequently carried out. Selective illumination of the cover layer 30 by means of laser direct imaging can therefore advantageously be obviated.

Figure 13:
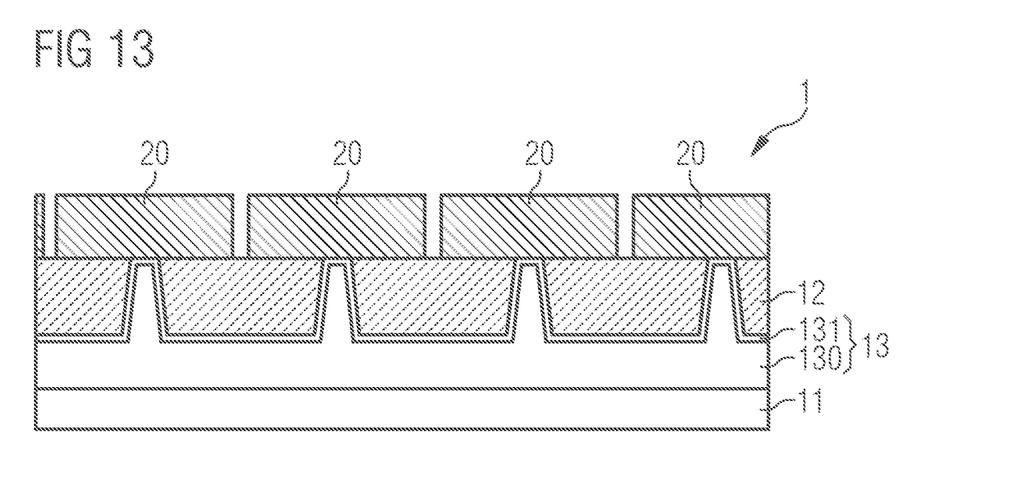
FIG. 13 shows a schematic sectional view of a donor substrate in a step of the method described here for selecting semiconductor components according to a fourth exemplary embodiment.

FIG. 13 shows a schematic sectional view of a donor substrate 1 in a step of the method described here for selecting semiconductor components 20 according to a fourth exemplary embodiment. The fourth exemplary embodiment as represented here corresponds substantially to the first exemplary embodiment represented in FIG. 1A.

In contrast to the first exemplary embodiment, the connecting layer 13 has a multilayer configuration and comprises a core layer 130 and an intermediate layer 131. The core layer 131 is formed with benzocyclobutene. The intermediate layer 131 is formed with silicon dioxide and is in direct contact with the semiconductor components 20. Advantageously, a defined adhesion between the connecting layer 13 and the semiconductor components 20 may thus be adjusted. Furthermore advantageously, direct contact of the core layer 130 with the semiconductor components 20 may be avoided. For example, an undesired chemical reaction between sensitive semiconductor components 20 and a core layer 130 formed with benzocyclobutene may be prevented.

Figure 14:
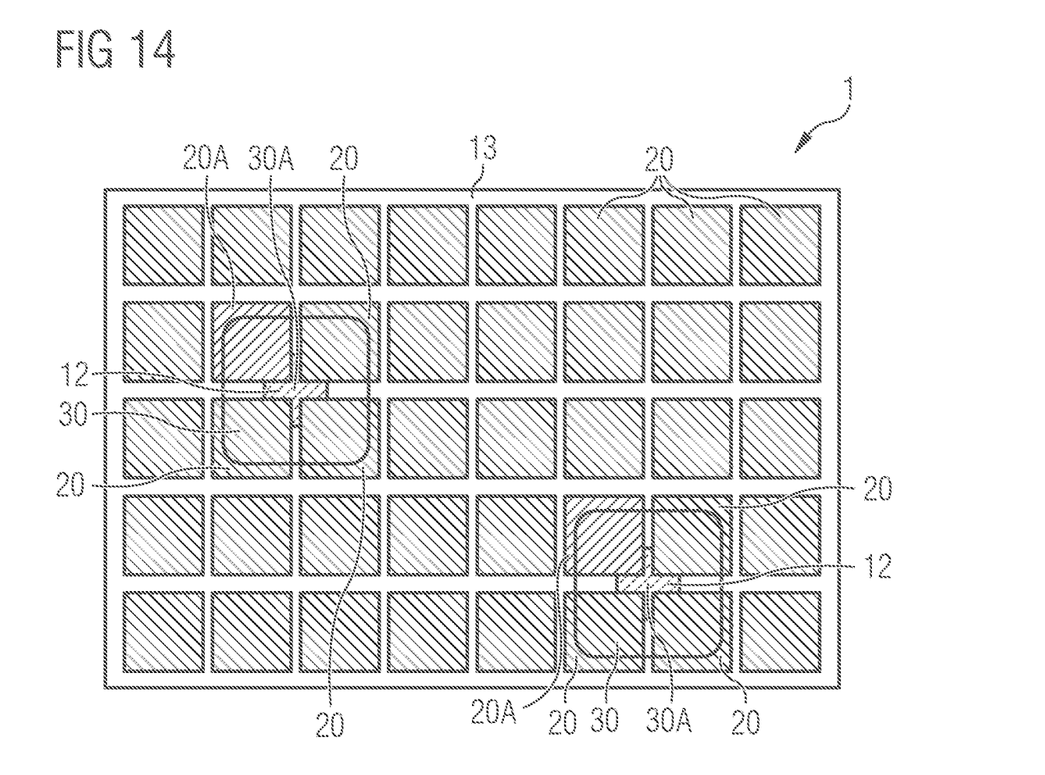
FIG. 14 shows a schematic plan view of a donor substrate in a step of the method described here for selecting semiconductor components according to a fifth exemplary embodiment.

FIG. 14 shows a schematic plan view of a donor substrate 1 in a step of the method described here for selecting semiconductor components 20 according to a fifth exemplary embodiment. In the step shown here, a cover layer 30 is applied over a total of four semiconductor components 20. In this case, the cover layer 30 overlaps with a semiconductor component 20A identified as defective and three directly adjacent semiconductor components 20.

The cover layer 30 remains particularly in the intermediate region 30A, which extends between the defective semiconductor component 20A and the directly adjacent semiconductor components 20.

In the plan view of the donor substrate 1 as shown in FIG. 14, the lateral extent of the sacrificial layer 12 can be seen. The sacrificial layer 12 remains particularly in the intermediate region 30A. By means of the remaining sacrificial layer 30, the four semiconductor components 20 below the cover layer 30 experience increased adhesion on the donor substrate 1. The defective semiconductor component 20A and the three directly adjacent semiconductor components 20 which are located below the cover layer 30 are consequently more difficult to extract from the donor substrate 1 in a subsequent process for extracting the semiconductor components 20.

Figure 15:
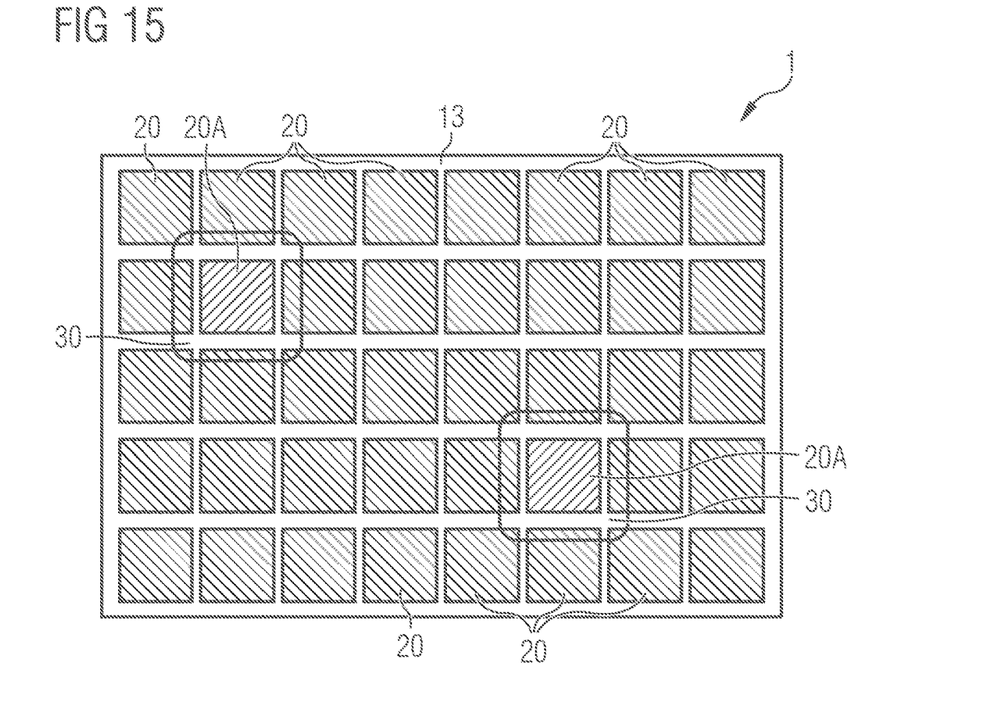
FIG. 15 shows a schematic plan view of a donor substrate in a step of the method described here for selecting semiconductor components according to a sixth exemplary embodiment.

FIG. 15 shows a schematic plan view of a donor substrate 1 in a step of the method described here for selecting semiconductor components 20 according to a sixth exemplary embodiment. According to the sixth exemplary embodiment as shown here, a cover layer 30 is applied onto a defective semiconductor component 20A and all directly adjacent semiconductor components 20.

In the case of a grid-like arrangement of the semiconductor components 20, there is therefore an extent of the cover layer 30 over nine semiconductor components 20. The removal of the sacrificial layer 12 may be carried out in such a way that a residue of the sacrificial layer 12 remains only below the defective semiconductor component 20A. Because of the remaining cover layer 30, however, the eight directly adjacent semiconductor components 20 around a defective semiconductor component 20A are more difficult to extract from the donor substrate 1 in a subsequent process for extracting the semiconductor components 20, or can no longer be extracted.

Figure 16:
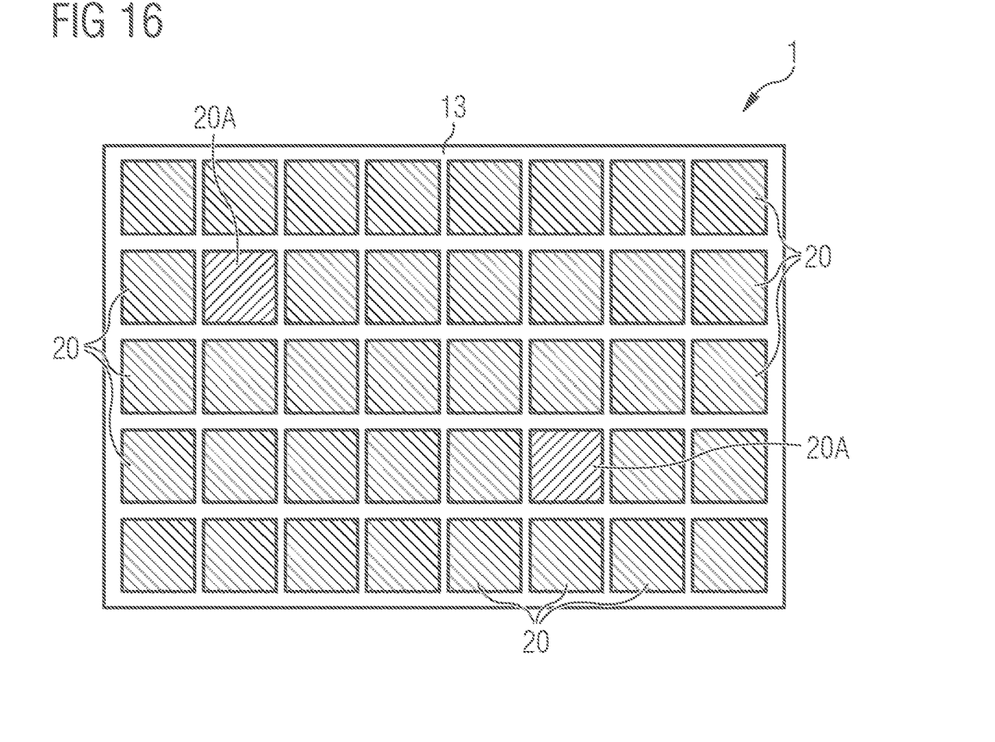
FIG. 16 shows a schematic plan view of a donor substrate in a further step of the method described here for selecting semiconductor components according to the sixth exemplary embodiment.

FIG. 16 shows a schematic plan view of a donor substrate 1 in a further step of the method described here for selecting semiconductor components according to the sixth exemplary embodiment. The cover layer 30 is removed from the semiconductor components 20, for example by a thermal process step for ashing the cover layer 30.

Consequently, the semiconductor components 20 directly adjacent to a defective semiconductor component 20A can be extracted easily from the donor substrate 1 by a subsequent process for extracting the semiconductor components 20 from the donor substrate 1. The defective semiconductor component 20A, on the other hand, adheres more strongly on the donor substrate 1 because of a residue of the sacrificial layer 12 which is present, and can consequently be extracted only with difficulty by the subsequent process for extracting the semiconductor components 20, or can no longer be extracted. Particularly advantageously, in this exemplary embodiment all non-defective semiconductor components 20 can be extracted from the donor substrate 1, while defective semiconductor components 20A remain on the donor substrate 1.

The invention is not restricted by the description with the aid of the exemplary embodiments. Rather, the invention comprises any new feature and any combination of features, which in particular includes any combination of features in the patent claims, even if this feature or this combination is not itself explicitly specified in the patent claims or the exemplary embodiments.

The invention claimed is:

1. A method comprising:
providing a donor substrate comprising a sacrificial layer, a connecting layer, and a plurality of semiconductor components arranged on the sacrificial layer, the connecting layer at least locally passing fully through the sacrificial layer so that each semiconductor component is at least locally in direct contact with the connecting layer;
performing a selection method for identifying defective semiconductor components;
selectively applying a cover layer onto a defective semiconductor component, at least one semiconductor component arranged directly adjacent to the defective semiconductor component and an intermediate region located between these semiconductor components;
selectively etching the sacrificial layer, wherein the cover layer reduces or avoids etching the sacrificial layer in the intermediate region; and
removing the semiconductor components from the donor substrate, the defective semiconductor component remaining on the donor substrate,
wherein the cover layer is formed with a photosensitive polymer.

2. The method as claimed in claim 1, wherein the photosensitive polymer is formed with a negative photoresist.

3. The method as claimed in claim 1, wherein selectively applying the cover layer comprises selectively applying the cover layer by a selective printing method.

4. The method as claimed in claim 1, wherein the cover layer is initially applied surface-wide onto the donor substrate and is subsequently illuminated selectively.

5. The method as claimed in claim 1, wherein removing the semiconductor components is performed by an adhesion die that comprises a plurality of adhesion faces.

6. The method as claimed in claim 5, wherein an adhesion of the semiconductor components to the adhesion faces takes place predominantly by Van der Waals forces.

7. The method as claimed in claim 5, wherein the adhesion faces are arranged on the adhesion die with a first lateral spacing from one another, which corresponds to two or more times a second lateral spacing of the semiconductor components with respect to one another on the donor substrate.

8. The method as claimed in claim 1, wherein etching the sacrificial layer comprises an isotropic etching method.

9. The method as claimed in claim 8, wherein etching the sacrificial layer comprises a plasma etching method or a wet chemical etching method.

10. The method as claimed in claim 1, wherein the sacrificial layer is formed with one of the following materials: Si, $SiO_2$, Ge or ZnO.

11. The method as claimed in claim 1, wherein the connecting layer is formed with one of the following materials: solder material or benzocyclobutene.

12. The method as claimed in claim 1, wherein the connecting layer has a contact area respectively with a semiconductor component of at least 0.01 $\mu m^2$ and at most 10 $\mu m^2$.

13. The method as claimed in claim 1, wherein the cover layer is removed from the donor substrate after etching the sacrificial layer and before removing the semiconductor components.

14. The method as claimed in claim 1, wherein performing the selection method comprises performing a measurement of a photoluminescence property of the semiconductor components.

15. The method as claimed in claim 1, wherein the at least one semiconductor component arranged directly adjacent to the defective semiconductor component remains on the donor substrate.

16. The method as claimed in claim 1, wherein the connecting layer is a multilayer.

17. A method comprising:
providing a donor substrate comprising a sacrificial layer, a connecting layer, and a plurality of semiconductor components arranged on the sacrificial layer, the connecting layer at least locally passing fully through the sacrificial layer so that each semiconductor component is at least locally in direct contact with the connecting layer;
performing a selection method for identifying defective semiconductor components;
selectively applying a cover layer onto a defective semiconductor component, at least one semiconductor component arranged directly adjacent to the defective semiconductor component and an intermediate region located between these semiconductor components;
selectively etching the sacrificial layer, wherein the cover layer reduces or avoids etching the sacrificial layer in the intermediate region; and
removing the semiconductor components from the donor substrate, the defective semiconductor component remaining on the donor substrate,
wherein selectively applying the cover layer comprises selectively applying the cover layer by a selective printing method.

18. A method comprising:
providing a donor substrate comprising a sacrificial layer, a connecting layer, and a plurality of semiconductor components arranged on the sacrificial layer, the connecting layer at least locally passing fully through the sacrificial layer so that each semiconductor component is at least locally in direct contact with the connecting layer;
performing a selection method for identifying defective semiconductor components;
selectively applying a cover layer onto a defective semiconductor component, at least one semiconductor component arranged directly adjacent to the defective semiconductor component and an intermediate region located between these semiconductor components;
selectively etching the sacrificial layer, wherein the cover layer reduces or avoids etching the sacrificial layer in the intermediate region; and
removing the semiconductor components from the donor substrate, the defective semiconductor component remaining on the donor substrate,
wherein the cover layer is initially applied surface-wide onto the donor substrate and is subsequently illuminated selectively.

19. A method comprising:
providing a donor substrate comprising a sacrificial layer, a connecting layer, and a plurality of semiconductor components arranged on the sacrificial layer, the connecting layer at least locally passing fully through the sacrificial layer so that each semiconductor component is at least locally in direct contact with the connecting layer;
performing a selection method for identifying defective semiconductor components;
selectively applying a cover layer onto a defective semiconductor component, at least one semiconductor component arranged directly adjacent to the defective semiconductor component and an intermediate region located between these semiconductor components;
selectively etching the sacrificial layer, wherein the cover layer reduces or avoids etching the sacrificial layer in the intermediate region; and
removing the semiconductor components from the donor substrate, the defective semiconductor component remaining on the donor substrate,
wherein the cover layer is removed from the donor substrate after etching the sacrificial layer and before removing the semiconductor components.

20. The method as claimed in claim 19, wherein the cover layer is removed from the donor substrate after etching the sacrificial layer and before removing the semiconductor components.

* * * * *